(12) United States Patent
Yamaguchi et al.

(10) Patent No.: US 7,566,933 B2
(45) Date of Patent: Jul. 28, 2009

(54) TRENCH-GATE SEMICONDUCTOR DEVICE AND MANUFACTURING METHOD OF TRENCH-GATE SEMICONDUCTOR DEVICE

(75) Inventors: Yoshihiro Yamaguchi, Saitama (JP); Yusuke Kawaguchi, Miura-gun (JP); Syotaro Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/484,664

(22) Filed: Jul. 12, 2006

(65) Prior Publication Data

US 2007/0023793 A1    Feb. 1, 2007

(30) Foreign Application Priority Data

Jul. 14, 2005    (JP)    ............................ P2005-206039

(51) Int. Cl.
    *H01L 29/78*    (2006.01)
(52) U.S. Cl. ............... 257/330; 257/335; 257/E27.091; 257/E29.26
(58) Field of Classification Search ................ 257/139, 257/141, 146, 329, 330–332, 219, 335–338, 257/341, E27.091, E27.095, E29.201, E29.257, 257/E29.26
See application file for complete search history.

(56) References Cited

U.S. PATENT DOCUMENTS

| | | | |
|---|---|---|---|
| 5,838,026 A | * | 11/1998 | Kitagawa et al. ............ 257/139 |
| 5,960,264 A | * | 9/1999 | Takahashi ................... 438/133 |
| 6,747,295 B2 | | 6/2004 | Inoue et al. |
| 6,888,196 B2 | | 5/2005 | Kobayashi |
| 2005/0035398 A1 | | 2/2005 | Williams et al. |

FOREIGN PATENT DOCUMENTS

JP    2005-79448    3/2005

* cited by examiner

*Primary Examiner*—Matthew Smith
*Assistant Examiner*—Quovaunda Jefferson
(74) *Attorney, Agent, or Firm*—Oblon, Spivak, McClelland, Maier & Neustadt, P.C.

(57) ABSTRACT

Disclosed is a trench-gate semiconductor device including: a trench gate structure; a source layer having a first conductivity type, facing a gate electrode via a gate insulating film, and having a top plane; a base layer having a second conductivity type, being adjacent to the source layer, and facing the gate electrode via the gate insulating film; a semiconductor layer having the first conductivity type, being adjacent to the base layer, and facing the gate electrode via the gate insulating film without contacting the source layer; and a contact layer having the second conductivity type, contacting the source layer and base layer, having a top plane continuing with the top plane of the source layer, and having two or more peaks in an impurity concentration value profile in a depth direction from the top plane thereof, the peaks being positioned shallower than a formed depth of the source layer.

16 Claims, 4 Drawing Sheets

TRENCH-GATE SEMICONDUCTOR DEVICE AND MANUFACTURING METHOD OF TRENCH-GATE SEMICONDUCTOR DEVICE

CROSS-REFERENCE TO RELATED APPLICATIONS

This application is based upon and claims the benefit of priority from the prior Japanese Patent Application No. 2005-206039, filed on Jul. 14, 2005; the entire contents of which are incorporated herein by reference.

BACKGROUND

1. Field of the Invention

The present invention relates to a semiconductor device formed by burying a gate electrode in a trench (trench-gate semiconductor device) and a manufacturing method thereof, and more particularly, to a trench-gate semiconductor device suitable to ensure avalanche tolerance while reducing on-resistance and a manufacturing method of the same.

2. Description of the Related Art

Trench-gate semiconductor devices are required to sufficiently lower a generated voltage in an on-state (on-voltage) to reduce loss and so forth, and this is especially required for power application generally. For this purpose, for example, it is effective to increase density of a channel region by narrowing the pitch between plural provided gate electrodes. Further, it is also effective to adopt a structure in which the region positioned to face the gate electrode becomes the channel region as well as possible.

However, when the microfabrication or the structure as described above is performed or adopted, it becomes difficult to form a contact layer for keeping a base layer, which is to be the channel region, at a voltage of a lower electric potential side electrode from the viewpoint of ensuring an area to form the contact layer. Further, since there is no other choice but to reduce the area of the contact layer itself, it is difficult to form a deep region, and possible to lose assured contact with the base layer existing under. When the contact with the base layer is not assured, the potential of the base layer floats from the potential of the lower electric potential side electrode, in which a parasitic transistor is turn on to thereby reduce avalanche tolerance.

Note that there is disclosed one in a below patent document 1, which has externally almost the same problem to be solved as of the trench-gate semiconductor device disclosed in the present application, whereas the one has a structure different from that of the trench-gate semiconductor device disclosed in the present application.

[Patent document 1] JP-A 2005-79448 (KOKAI)

SUMMARY

A trench-gate semiconductor device according to one mode of the present invention includes: a gate electrode formed to be buried in a trench; a gate insulating film surrounding the gate electrode; a source layer having a first conductivity type, positioning to face the gate electrode via a part of the gate insulating film, and having a top plane; a base layer having a second conductivity type, being adjacent to the source layer, and positioning to face the gate electrode via another part of the gate insulating film; a semiconductor layer having the first conductivity type, being adjacent to the base layer, and positioning to face the gate electrode via still another part of the gate insulating film without being in contact with the source layer; and a contact layer having the second conductivity type, being in contact with the source layer and the base layer, having a top plane continuing with the top plane of the source layer, and having two or more peaks in a profile of impurity concentration values in a depth direction from the top plane thereof, the two or more peaks being positioned at positions shallower than a formed depth of the source layer.

The trench-gate semiconductor device according to another mode of the present invention includes: a gate electrode formed to be buried in a trench; a gate insulating film surrounding the gate electrode; a source layer having a first conductivity type, positioning to face the gate electrode via a part of the gate insulating film, and having a top plane; a base layer having a second conductivity type, being adjacent to the source layer, and positioning to face the gate electrode via another part of the gate insulating film; a semiconductor layer having the first conductivity type, being adjacent to the base layer, and positioning to face the gate electrode via still another part of the gate insulating film without being in contact with the source layer; and a contact layer having the second conductivity type, being in contact with the source layer and the base layer, having a top plane continuing with the top plane of the source layer, and having two or more peaks in a size distribution of a transverse section in a depth direction from the top plane thereof, the two or more peaks being positioned at positions shallower than a formed depth of the source layer.

Furthermore, a manufacturing method of a trench-gate semiconductor device according to still another mode of the present invention is the manufacturing method of the trench-gate semiconductor device having forming a trench in a semiconductor region and forming a gate electrode to be buried in the trench formed, the method including: forming a semiconductor region having a first conductivity type on a semiconductor substrate; forming a base layer having a second conductivity type on the semiconductor region formed; forming a source layer having the first conductivity type on the base layer formed; and forming a contact layer having the second conductivity type so as to pass through the formed source layer to reach the base layer by performing ion implantation through at least two steps each having a different acceleration energy with each other.

DETAILED DESCRIPTION

Explanation of Embodiments

Figure 1:
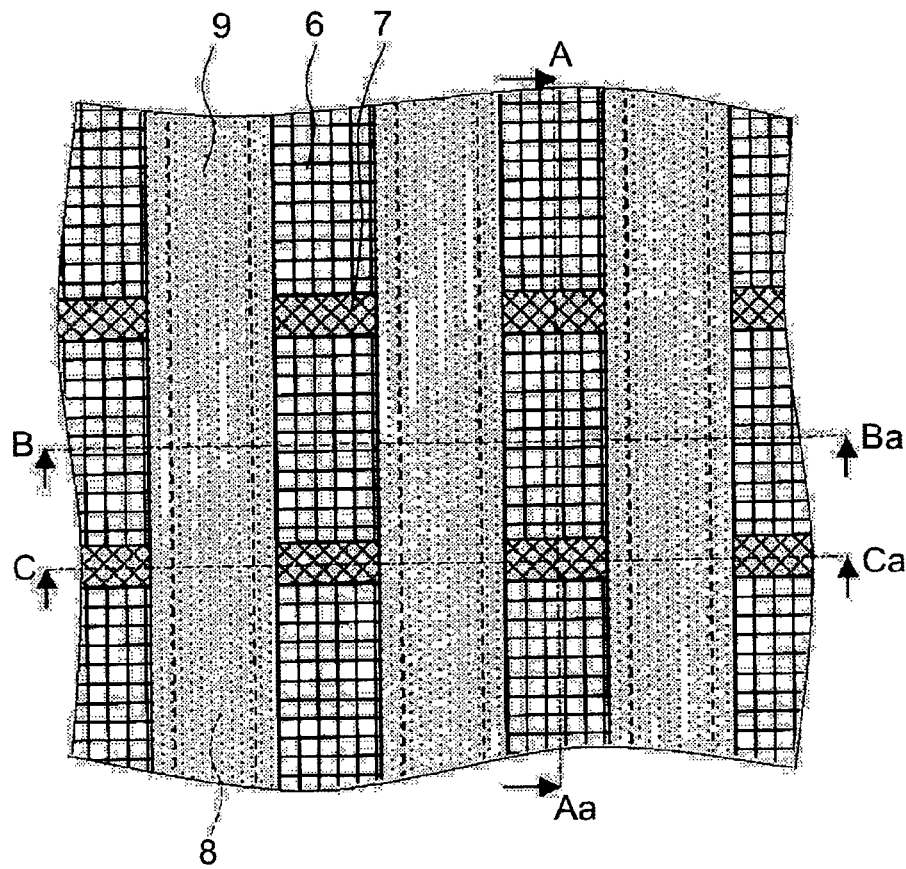
FIG. 1 is a virtual view of a top surface schematically showing a structure of a trench-gate semiconductor device (MOSFET) except the portion of a source electrode, according to an embodiment of the present invention.

Embodiments of the present invention will be described with reference to the drawings, however, the drawings are provided for the purpose only of illustration and the present invention is in no case limited thereby.

In a trench-gate semiconductor device according to one mode of the present invention, a p-type contact layer is in contact with an n-type source layer and a p-type base layer, has an top plane continuing with a top plane of the n-type source layer, and has two or more peaks in a profile of impurity concentration values in a depth direction from the top plane thereof. Further, in a trench-gate semiconductor device according to another mode of the present invention, the p-type contact layer is in contact with the n-type source layer and the p-type base layer, has an top plane continuing with a top plane of the n-type source layer, and has two or more peaks in a size distribution of a transverse section in a depth direction from the top plane thereof.

These are those in which, for example, ion implantation is performed by at least two steps by changing the acceleration energy, whereas the p-type contact layer can be formed by the ion implantation from the top surface side. In the case of the p-type contact layer as described above, it is possible to ensure the region to form the p-type contact layer surely reaching from a surface layer to the p-type base layer. Further, it is possible to provide a plurality of gate electrodes and narrow the pitch between them, so that the density of a channel region can be increased. Accordingly, avalanche tolerance can be ensured while reducing the on-resistance.

As a form of an embodiment of the present invention, it is possible that the gate electrode is formed to be buried in a plurality of trenches positioned in parallel to each other, and that the p-type contact layer is formed to have a striped shape having a direction orthogonal to a direction the plural trenches extend, and have a discontinuous shape by being laterally cut by the gate electrode. When the p-type contact layer is formed in the direction orthogonal to a direction the trenches extend, typically, the positioning of the p-type contact layer with the trenches becomes unnecessary, being an advantage in view of the production process.

Here, it is possible that each width of the striped shape of the p-type contact layer is twice or below of a distance between a height position that the p-type base layer facing the gate electrode via the gate insulating film is in contact with the n-type source layer at and a height position that the p-type base layer facing the gate electrode via the gate insulating film is in contact with the n-type semiconductor layer. When it is under such conditions as described above, sufficiently small on-resistance saturated nearly at a lower limit value can be obtained. It is considered that effective density of formed channel does not increase even under the twice, and therefore the on-resistance is saturated at the lower limit value.

Further, as a form, it is possible that the p-type contact layer is positioned to face the gate electrode via the gate insulating film only. For instance, such a form can be obtained by forming the p-type contact layer to have a striped shape before forming the trench.

In a manufacturing method of a trench-gate semiconductor device according to still another mode of the present invention, at least, a two-step ion implantation using different acceleration energies is performed in the formation of the p-type contact layer. With this, such a p-type contact layer as passes through the n-type source layer to reach to the p-type base layer can be formed easily. Accordingly, the trench-gate semiconductor device manufactured by such a manufacturing method can ensure avalanche tolerance while reducing on-resistance.

Based on the above, embodiments of the present invention will be described with reference to the drawings. FIG. 1 is a virtual view of a top surface schematically showing a structure of a trench-gate semiconductor device (MOSFET: metal oxide semiconductor field effect transistor) except a portion of a source electrode, according to an embodiment of the present invention. The source electrode is formed over the entire surface of the top surface shown in the drawing. In FIG. 1, the same patterns are formed repeatedly in the not-shown latitudinal direction of the drawing, and the same pattern is extended in the not-shown longitudinal direction of the drawing.

As shown in FIG. 1, in the MOSFET, gate electrodes 8 are formed to be buried in a plurality of parallel trenches respectively, and the top portions of the respective gate electrodes 8 are covered by insulating films 9 (shown by dot patterns). Hereinafter, such a structure of the gate electrode 8 as described above is sometimes called a trench gate structure. The respective gate electrodes 8 are electrically conducted at their end portions in the extending direction, composing a single gate terminal.

Between the trench gate structures, basically, n-type source layers 6 (shown by a lattice pattern) are formed, and, further, p-type contact layers 7 (shown by a cross-hatching pattern) are formed sometimes such that the p-type contact layers 7 segment the n-type source layers 6. The p-type contact layer 7 has substantially the same top plane as of the n-type source layer 6 and the insulating film 9, has a striped shape crossing orthogonally the extending direction of the trench gate structure on the whole, and is discontinued by the gate electrodes 8 crossing laterally.

Figure 2:
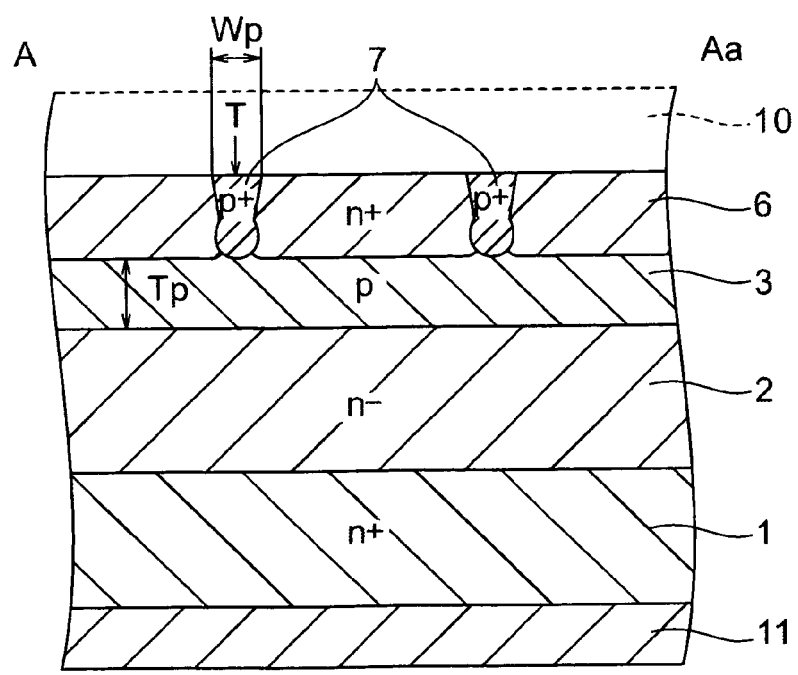
FIG. 2 is a schematic sectional view taken along an A-Aa line in FIG. 1 and viewing from the direction shown by related arrows in the drawing.

FIG. 2 is a schematic sectional view taken along an A-Aa line in FIG. 1 and viewing from the direction shown by related arrows. In FIG. 2, the same portions as shown in FIG. 1 are denoted by the same numerals. As shown in FIG. 2, under the n-type source layer 6 and p-type contact layer 7, a p-type base layer 3 is positioned to contact therewith, and further under the p-type base layer 3, a n-type semiconductor layer 2, a semiconductor substrate 1, and a drain electrode 11 are positioned, respectively, in a stacked manner. The semiconductor substrate 1 is of an n-type, having a higher impurity concentration than that of the n-type semiconductor layer 2. The impurity concentration of the p-type contact layer 7 is higher than that of the p-type base layer 3. This is because to reduce contact resistance with the source electrode 10.

In FIG. 2, the pitch of the p-type contact layers 7 formed is, for example, 1 μm to 3 μm; a width Wp of the p-type contact layer 7 is, for example, 0.2 μm; a thickness of the n-type source layer 6 formed is, for example, 0.5 μm; and a thickness Tp of the p-type base layer 3 formed is, for example, 0.4 μm. As for the ratio of the width Wp of the p-type contact layer 7 to the thickness Tp of the p-type base layer 3, a preferable one will be described later.

The p-type contact layer 7 has a characteristic point in its production process (which will be described later), so that the size distribution of the transverse section of the p-type contact layer 7 in a depth direction from the top plane thereof has, at least, two peaks, as shown in the drawing. Further, when viewing from a different aspect, the p-type contact layer 7 has, at least, two peaks in a profile of impurity concentration in a depth direction from the top plane thereof. These "peaks" include a case of an end portion that ends in the course of the increase in addition to the case of a local maximum value formed in an intermediate position in the depth direction.

Figure 3:
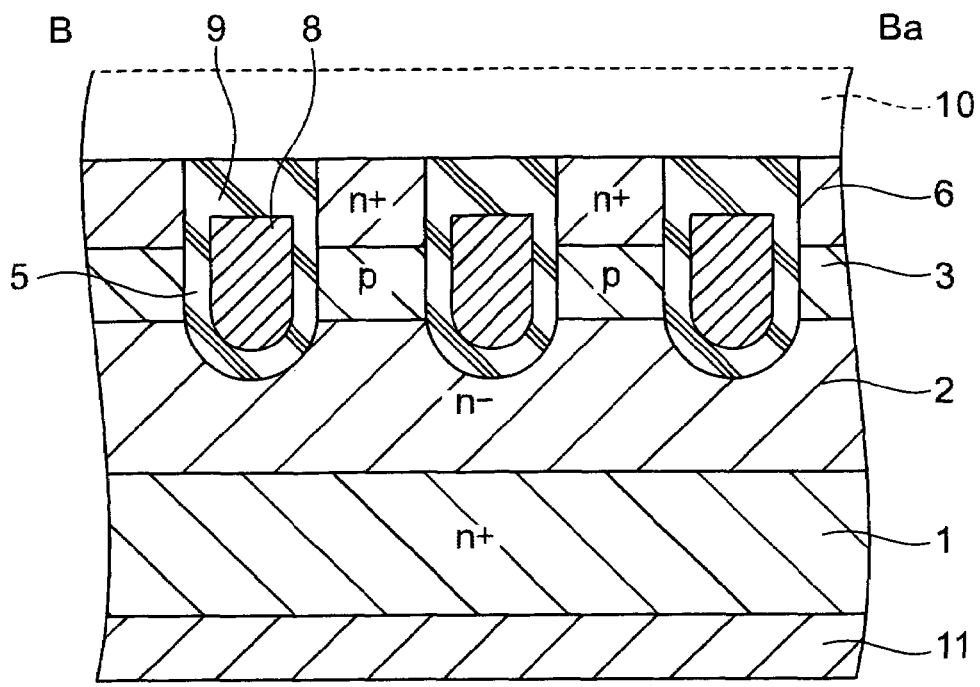
FIG. 3 is a schematic sectional view taken along a B-Ba line in FIG. 1 and viewing from the direction shown by related arrows in the drawing.

FIG. 3 is a schematic sectional view taken along a B-Ba line in FIG. 1 and viewing from the direction shown by related arrows. In FIG. 3, the portions already described in the above-described drawings are denoted by the same numerals. As shown in FIG. 3, the side surface and the bottom side of the gate electrode 8 are covered by a gate insulating film 5. The gate electrode 8 and the gate insulating film 5 (namely, the portion of the trench gate structure) are formed to pass through the n-type source layer 6 and the p-type base layer 3 to reach into the n-type semiconductor layer 2.

Based on this structure, the gate electrode 8 faces the n-type source layer 6 via the gate insulating film 5 at its upper portion side, faces the p-type base layer 3 via the gate insulating film 5 at its portion under the upper portion, and faces the n-type semiconductor layer 2 via the gate insulating film 5 at its portion thereunder. In the region of the p-type base layer 3 positioned to face the gate electrodes 8 via the gate insulating film 5, a channel (n-channel) is formed. In other words, in FIG. 3, the channel is formed to have a curtain shape in the back direction in the drawing. The formation of the channel of such a curtain shape is performed except the width portions of the p-type contact layer 7, so that it is possible to improve the density of the channel and to reduce on-resistance sufficiently as the p-type contact layer 7 has a narrower width.

In FIG. 3, the pitch of the gate electrodes 8 formed is, for example, 0.7 μm, and the width of the trench gate structure is, for example, 0.3 μm. At this time, the width of the n-type source layer 6 and the p-type base layer 3, which are sandwiched by the portion of the trench gate structure, comes to 0.4 μm. Further, the depth of the portion of the trench gate structure formed is, for example, 1.1 μm, and furthermore, the thickness of the gate insulating film 5 is, for example, 60 nm and the thickness of the insulating film 9 on the top surface of the gate electrodes 8 is, for example, 0.3 μm.

Figure 4:
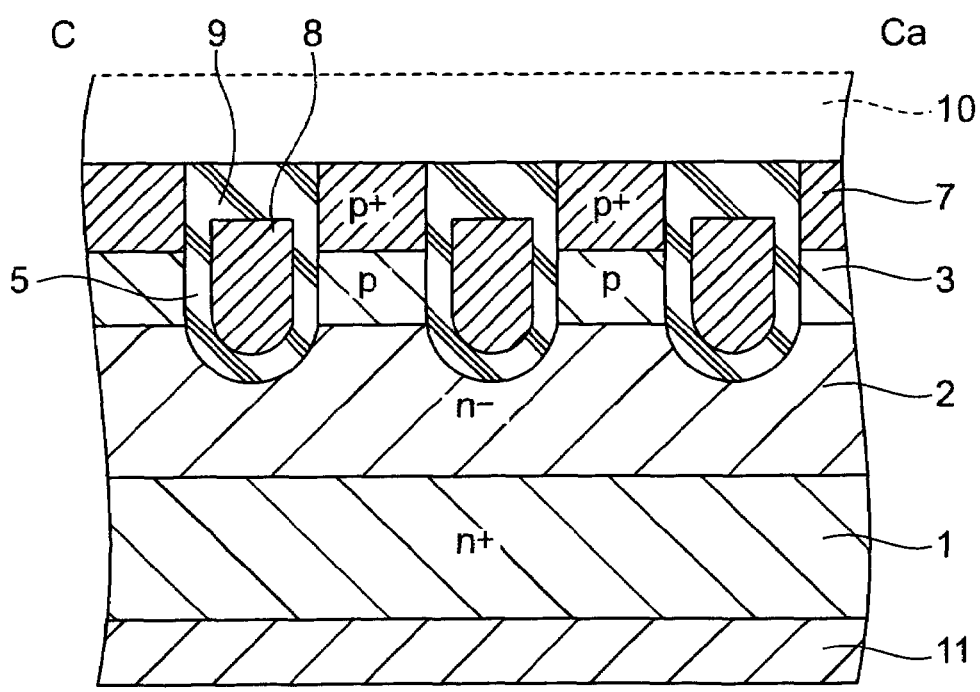
FIG. 4 is a schematic sectional view taken along a C-Ca line in FIG. 1 and viewing from the direction shown by related arrows in the drawing.

FIG. 4 is a schematic sectional view taken along a C-Ca line in FIG. 1 and viewing from the direction shown by related arrows. In FIG. 4, the portions already described in the above-described drawings are denoted by the same numerals. As shown in FIG. 4 (or as can be known by FIG. 2), the p-type contact layer 7 is disposed in a stacked manner on the p-type base layer 3 while it is in contact therewith, assuming to establish conductivity between the p-type semiconductor regions. With this, the electric potential of the p-type base layer 3 is surely fixed to the electric potential of the electrode 10.

In the above, the structure of the MOSFET according to the embodiment of the present invention has been described over-all, and the characteristic in view of structure and shape is that the p-type contact layer 7 is formed to pass through the n-type source layer 6 to be surely in contact with the p-type base layer 3 even though the width Wp (for example, 0.2 μm) of the p-type contact layer 7 in FIG. 2 is sufficiently narrower in comparison with the pitch (for example, 1 μm) of the p-type contact layers 7 formed. By reducing the width Wp of the p-type contact layer 7, the channel density is improved and the on-resistance is reduced (as a MOSFET, on-resistance=several mΩ, as an example), and at the same time, by making sure that the p-type contact layer 7 is in contact with the p-type base layer 3, sufficient avalanche tolerance (withstand voltage=40 V, as an example) is ensured.

As has been already described, the narrower the width Wp of the p-type contact layer 7 is, the p-type base layer 3 at the under side of the n-type source layer 6 in FIG. 2 serves all the more wider as a channel, so that the on-resistance is reduced. Meanwhile, when the connection between the p-type contact layer 7 and the p-type base layer 3 is not ensured, the electric potential of the p-type base layer 3 tends to increase over the electric potential of the source electrode 10, so that holes generated in the p-type base layer 3 are implanted into the n-type source layer 6. With this, a parasitic NPN transistor composed of the n-type semiconductor layer 2, the p-type base layer 3 and the n-type source layers 6 turns into an on state to reduce the avalanche tolerance as a MOSFET. In the present embodiment, such a reduction in avalanche resistance is not caused.

Note that the smaller the formed thickness of the n-type source layer 6 is, the easier is to ensure the connection between the p-type contact layer 7 and the p-type base layer 3. However, the thickness of the n-type source layer 6 formed has to be determined so that the n-type source layer 6 serves as a source region by being positioned to face the gate electrode 8 via the gate insulating film 5 (refer to FIG. 3), whereby the formed thickness is 0.5 μm in the present embodiment.

Hereinafter, the description will be given of major parts of the production process of the above-described MOSFET. Refer to FIG. 2 to FIG. 4 as appropriate. First, the n-type semiconductor layer 2 is formed over the entire surface of the semiconductor substrate 1 by epitaxial growth. After that, the p-type base layer 3 is formed by performing ion implantation of, for example, boron to entire surface of the portion of the upper layer side of the n-type semiconductor layer 2 formed and by diffusing them.

Subsequently, forming a mask leaving the region corresponding to the portion of the p-type contact layer 7 to be formed and having a striped shape on the top surface, the n-type source layer 6 is formed by performing selective ion implantation, for example, of phosphor via the mask, and diffusing them. After that, the mask is replaced with a mask without region corresponding to the portion of the p-type contact layer 7 to be formed, the ion implantation, for example, of boron is performed via the mask, and further they are diffused, so that the p-type contact layer 7 is formed.

The first ion plantation to form the p-type contact layer 7 is performed, for example, under the conditions: acceleration energy of 100 to 200 ev, and a dose amount of $1 \times 10^{14}$ to $1 \times 10^{15}$ cm$^{-2}$. After that, as a second one, the ion plantation is performed, for example, under the conditions: acceleration energy of 30 to 60 eV, and a dose amount of $1 \times 10^{14}$ to $1 \times 10^{15}$ cm$^{-2}$. By performing the ion implantation as described above, the peak of the impurity concentration by the first ion implantation arises at a position being 0.3 to 0.5 μm in the depth direction, so that the p-type contact layer 7 having sufficient depth reaching to the p-type base layer 3 can be formed. Further, by the second ion implantation, the p-type contact layer 7 positioned shallower than that is formed.

By forming the p-type contact layer 7 in the above-described manner, the p-type contact layer 7 comes to have the characteristic in view of shape as described above (the impurity concentration profile in the depth direction has two peaks or the size distribution in the depth direction of the transverse section has two peaks). Note that, in the above-described example, the ion implantation is performed by being divided into two steps by changing acceleration energy, however, the ion implantation may be divided into three steps or more by changing the acceleration energy, respectively, for the same purpose.

When the p-type contact layer 7 is formed, the trenches to bury the gate electrodes 8 therein are formed, for example, by RIE (reactive ion etching) method. By forming the trenches in the direction orthogonal to the p-type contact layer 7 after the p-type contact layer 7 is formed, accuracy of positioning the p-type contact layer 7 and the trenches is made unnecessary. As a result, the p-type contact layer 7 is formed to face the gate electrode 8 via only the gate insulating film 5, so that no n-type source layer 6 exists between them.

After the trench is formed, the gate insulating film 5 is formed on the side wall and bottom face of the trench; and further, for example, a polycrystalline silicon is deposited over the entire surface thereof, for example, by CVD (chemical vapor deposition) method so that the inside of the trench where the gate insulating film 5 is formed is buried thereby. After that, an etch back is performed so as to concave the polycrystalline silicon into the trench, so that the gate electrode 8 is formed. Furthermore, the insulating film 9 is formed, for example, by CVD method to cover the top surface of the gate electrode 8. The major parts of the production process have been described in the above. After that, the source electrode 10 and the drain electrode 11 are formed.

Figure 7:
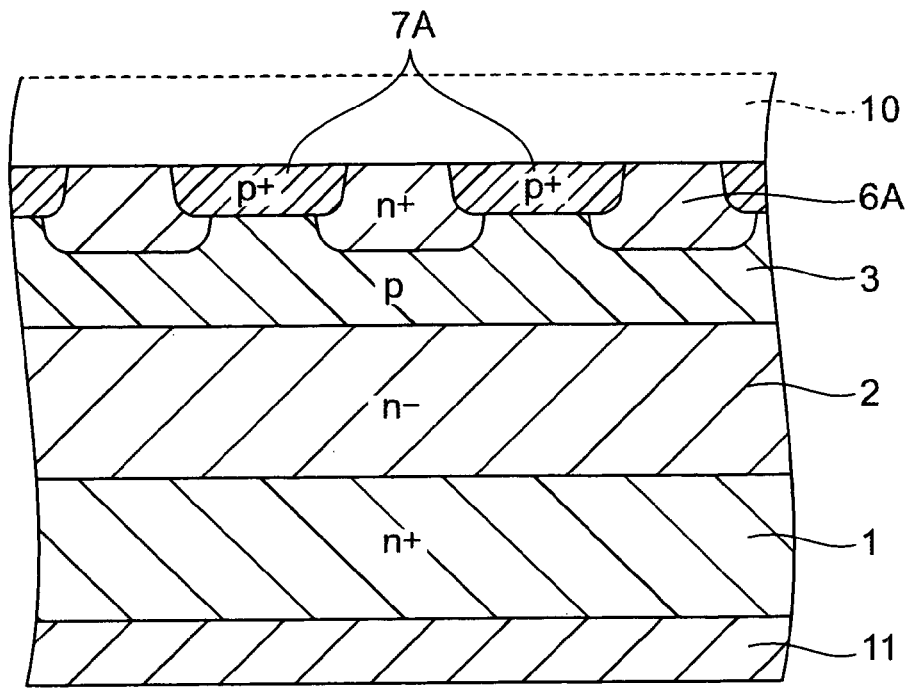
FIG. 7 is a schematic sectional view showing a structure as a comparative reference example (one example) in comparison with the structure of the section shown in FIG. 2.

FIG. 7 is a schematic sectional view showing a structure as a comparative reference example (one example) in comparison with the structure of the section shown in FIG. 2. In FIG. 7, the portions corresponding to the same portions as those already described are denoted by the same numerals. This comparative example shows a case where the width Wp of the p-type contact layer 7 in FIG. 2 can not be said to be sufficiently narrow as compared to the pitch of the p-type contact layers 7 formed. In such a case, according to the above-described production process, in the formation of an n-type source layer 6A by the ion implantation and diffusion, a sufficiently large region where ions are not diffused remains, as shown in the drawing. Accordingly, as shown in the drawing, it is easy to form a p-type contact layer 7A being surely in contact with the p-type base layer 3. However, the comparative reference example has a larger on-resistance due to a lower density of the formed channel, as a natural consequence.

Figure 8:
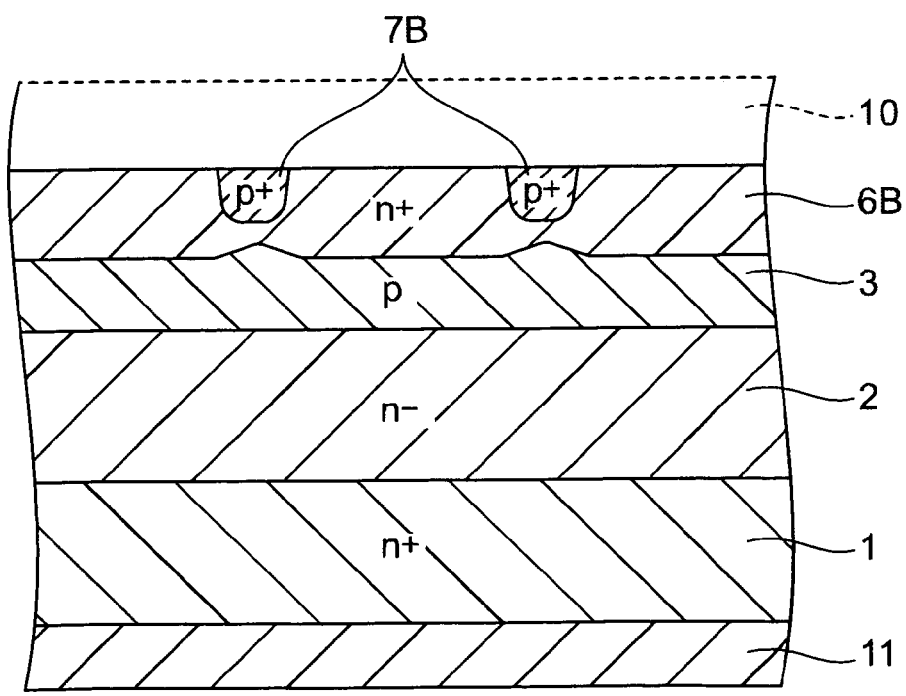
FIG. 8 is a schematic sectional view showing a structure as a comparative reference example (another example) in comparison with the structure of the section shown in FIG. 2.

FIG. 8 is a schematic sectional view showing a structure as a comparative reference example (another example) in comparison with the structure of the section shown in FIG. 2. The comparative example shows a case where the width Wp of the p-type contact layer 7 in FIG. 2 is simply made to be sufficiently narrow as compared to the pitch of the p-type contact layers 7 formed. In such a case, according to the above-described production process, in the formation of an n-type source layer 6B by the ion implantation and diffusion, almost no region where ions are not diffused remains between the n-type source layers 6B since the ions are diffused, as shown in the drawing. Accordingly, when a p-type contact layer 7B is formed with almost the same acceleration energy as that in FIG. 7, the p-type contact layer 7B is possibly formed shallowly, namely not sufficiently deep to reach the p-type base layer 3. With this, the electric potential of the p-type base layer 3 easily increases to over the electric potential of the source electrode 10, where the avalanche tolerance degrades.

With the comparison with FIG. 7 and FIG. 8, the advantage of the present embodiment is further apparent.

Figure 5:
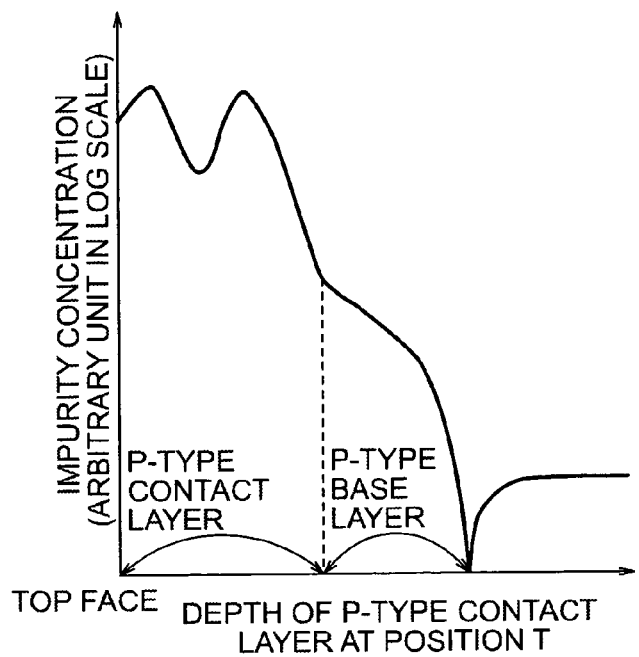
FIG. 5 is a view (calculated values) showing a distribution example of impurity concentration in the depth direction at a position T shown in FIG. 2.

FIG. 5 is a view (calculated values) showing a distribution example of the impurity concentration in the depth direction at the position T shown in FIG. 2. When forming the p-type contact layer 7, the ion implantation is performed by two steps with the mutually different acceleration energy, respectively, so that the impurity concentration shows two peaks in view of the depth direction. These two peaks are considered to correspond to the size distribution of the transverse section in the depth direction. Further, the depth of the p-type contact layer shown corresponds substantially to that of the n-type source layer 6, namely, the two peaks are within the depth of the n-type source layer 6 formed. Note that FIG. 5 shows calculated values, however, in the case of an actually manufactured MOSFET, it is possible to measure using, for example, a scanning capacitance microscope (SCM) or a scanning spread resistance microscope (SSRM).

Figure 6:
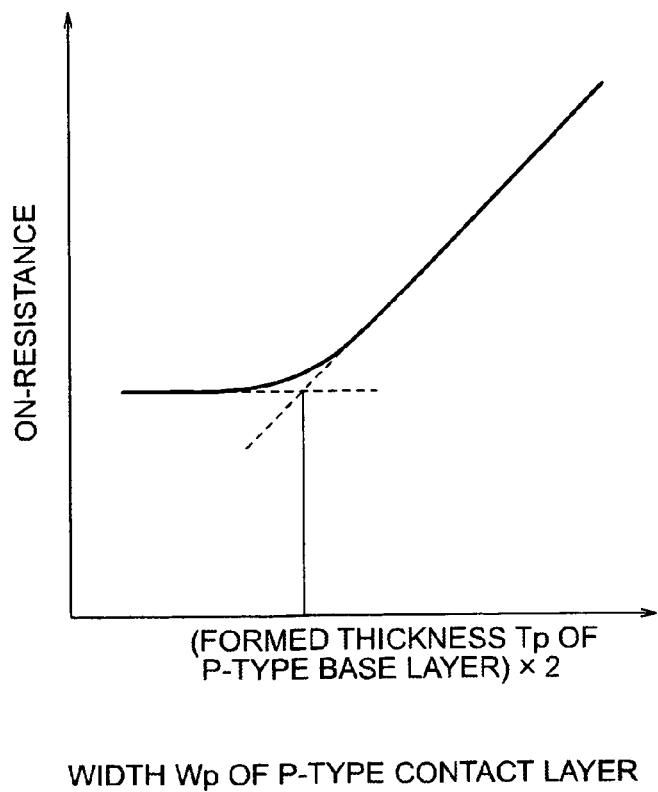
FIG. 6 is a graph (calculated values) illustrating on-resistance of the trench-gate semiconductor device (MOSFET) shown in FIG. 1 based on the relation between a width Wp of a p-type contact layer 7 and a thickness Tp of a p-type base layer 3 formed.

FIG. 6 is a graph (calculated values) illustrating the on-resistance of the trench-gate semiconductor device (MOSFET) shown in FIG. 1 based on the relation between the width Wp of the p-type contact layer 7 and the thickness Tp of the p-type base layer 3 formed. As shown in FIG. 6, as the width Wp of the p-type contact layer 7 reduces from a larger one, the on-resistance decreases at first. This is because the width of the channel formed in the p-type base layer 3 under the n-type source layer 6 is increased on the back of the width Wp of the p-type contact layers 7 being reduced.

When the width Wp of the p-type contact layer 7 is reduced further, the on-resistance shows a characteristic in which it is saturated at the lower limit. Referring to FIG. 2, even under the p-type contact layer 7, actually, electrons also flow in an oblique direction such that they exude from the n-type source layer 6 into the channel, hence, when the width Wp of the p-type contact layer 7 is smaller than a certain level, it is considered that the width of the channel is not increased further in terms of effectiveness. The on-resistance of the reducing tendency changes to show the saturated tendency at the lower limit at the time when the width Wp of the p-type contact layer 7 is approximately twice of the thickness Tp of the p-type base layer 3 formed as shown in the drawing (for example when Tp is 0.4 μm Wp is 0.8 μm.). Accordingly, preferably, the width Wp of the p-type contact layer 7 is approximately the twice (or therebelow) of the thickness Tp of the p-type base layer 3 formed in view of the on-resistance reduction, and it is impossible to obtain further effect to reduce the on-resistance even when the width Wp is reduced further.

Note that the procedures described as a manufacturing method is that forms the gate electrode 8 by forming the trench after the formation of the p-type base layer 3, the n-type source layer 6 and the p-type contact layer 7, however, the p-type base layer 3, the n-type source layer 6 and the p-type contact layer 7 may be formed after the formation of the gate electrode 8 after the formation of the trench.

In the above, embodiments of the present invention have been described. It is possible to obtain a semiconductor device having an opposite conductivity type by making the respective semiconductor layers having the n-type conductivity or the p-type conductivity be given an opposite conductivity.

It is to be understood that the present invention is not limited to specific examples herein described with reference to the drawings, and includes all such modifications as fall within the scope of the following claims.

What is claimed is:

1. A trench-gate semiconductor device, comprising:
a gate electrode formed to be buried in a trench;
a gate insulating film surrounding the gate electrode;
a source layer having a first conductivity type, positioned to face the gate electrode via a part of the gate insulating film, and having a top plane;
a base layer having a second conductivity type, being adjacent to the source layer, and positioned to face the gate electrode via another part of the gate insulating film;

a semiconductor layer having the first conductivity type, being adjacent to the base layer, and positioned to face the gate electrode via still another part of the gate insulating film without being in contact with the source layer; and a contact layer having the second conductivity type, being in contact with the source layer and the base layer, having a top plane continuing with the top plane of the source layer, and having two or more peaks in a profile of impurity concentration values in a depth direction from the top plane thereof, the two or more peaks of the profile being positioned at a depth shallower than a bottom of the source layer.

2. The trench-gate semiconductor device according to claim 1, wherein the gate electrode is formed to be buried in a plurality of trenches positioned in parallel to each other, and wherein the contact layer is formed to have a striped shape having a direction orthogonal to a direction the plural trenches extend, and have a discontinuous shape by being laterally cut by the gate electrode.

3. The trench-gate semiconductor device according to claim 2, wherein each width of the striped shape of the contact layer is twice or below of a distance between a height position that the base layer facing the gate electrode via the gate insulating film is in contact with the source layer at and a height position that the base layer facing the gate electrode via the gate insulating film is in contact with the semiconductor layer at.

4. The trench-gate semiconductor device according to claim 2, wherein each width of the striped shape of the contact layer is 0.8 µm at maximum.

5. The trench-gate semiconductor device according to claim 4, wherein the source layer is formed to have a thickness of 0.5 µm at minimum.

6. The trench-gate semiconductor device according to claim 1, wherein the contact layer is positioned to face the gate electrode via only the gate insulating film.

7. The trench-gate semiconductor device according to claim 1, wherein, of the two or more peaks in the profile of the impurity concentration values of the contact layer, a deepest peak is positioned at 0.3 µm to 0.5 µm from the top plane of the contact layer.

8. The trench-gate semiconductor device according to claim 1, wherein the contact layer includes boron as an impurity.

9. A trench-gate semiconductor device, comprising:
a gate electrode formed to be buried in a trench;
a gate insulating film surrounding the gate electrode;
a source layer having a first conductivity type, positioned to face the gate electrode via a part of the gate insulating film, and having a top plane;
a base layer having a second conductivity type, being adjacent to the source layer, and positioned to face the gate electrode via another part of the gate insulating film;
a semiconductor layer having the first conductivity type, being adjacent to the base layer, and positioned to face the gate electrode via still another part of the gate insulating film without being in contact with the source layer; and
a contact layer having the second conductivity type, being in contact with the source layer and the base layer, having a top plane continuing with the top plane of the source layer, and a width of the contact layer in a direction parallel to the top plane of the semiconductor layer changing along a depth direction of the contact layer to have two or more peaks, the two or more peaks being positioned at a depth shallower than a bottom of the source layer.

10. The trench-gate semiconductor device according to claim 9, wherein the gate electrode is formed to be buried in a plurality of trenches positioned in parallel to each other, and wherein the contact layer is formed to have a striped shape having a direction orthogonal to a direction the plural trenches extend, and have a discontinuous shape by being laterally cut by the gate electrode.

11. The trench-gate semiconductor device according to claim 10, wherein each width of the striped shape of the contact layer is twice or below of a distance between a height position that the base layer facing the gate electrode via the gate insulating film is in contact with the source layer at and a height position that the base layer facing the gate electrode via the gate insulating film is in contact with the semiconductor layer at.

12. The trench-gate semiconductor device according to claim 10, wherein each width of the striped shape of the contact layer is 0.8 µm at maximum.

13. The trench-gate semiconductor device according to claim 12, wherein the source layer is formed to have a thickness of 0.5 µm at minimum.

14. The trench-gate semiconductor device according to claim 9, wherein the contact layer is positioned to face the gate electrode via only the gate insulating film.

15. The trench-gate semiconductor device according to claim 9, wherein, of the two or more peaks in the size distribution of the transverse section of the contact layer, a deepest peak is positioned at 0.3 to 0.5 µm from the top plane of the contact layer.

16. The trench-gate semiconductor device according to claim 9, wherein the contact layer includes boron as an impurity.

* * * * *